United States Patent [19]

Stern et al.

[11] Patent Number: 4,805,198

[45] Date of Patent: Feb. 14, 1989

[54] CLOCK MULTIPLIER/JITTER ATTENUATOR

[75] Inventors: Kenneth J. Stern; Navdeep S. Sooch, both of Austin, Tex.; Jerrell P. Hein, West Lawn, Pa.

[73] Assignee: Crystal Semiconductor Corporation, Austin, Tex.

[21] Appl. No.: 51,985

[22] Filed: May 19, 1987

[51] Int. Cl.[4] ............................................. H04L 7/00
[52] U.S. Cl. .................................... 375/118; 375/110; 331/1 A
[58] Field of Search ................. 375/118, 110; 370/100, 370/103; 331/1 A

[56] References Cited

U.S. PATENT DOCUMENTS

| 4,129,748 | 12/1978 | Saylor | 375/120 |
| 4,539,531 | 9/1985 | Thomas et al. | 331/11 |
| 4,551,845 | 11/1985 | ab der Holden et al. | 375/118 X |
| 4,633,488 | 12/1986 | Show | 375/110 X |

OTHER PUBLICATIONS

Yarak, Dennis et al., "A 2.56 Mb/s Digital Local-Loop Transmitter/Receiver," 1985 IEEE International Solid-State Circuits Conference, 32nd ISSCC. Digest of Technical Papers, pp. 154–155, 330, New York, N.Y.

Primary Examiner—A. D. Pellinen
Assistant Examiner—Derek S. Jennings
Attorney, Agent, or Firm—Leonard & Lott

[57] ABSTRACT

A clock multiplier/jitter attenuator circuit provides a stable clock which is a multiple frequency of the average frequency of an external digital data stream. The external data is written into successive storage cells of a FIFO at its own clock rate and read out of the FIFO at the rate of an internal clock signal which is formed by frequency dividing the stable clock. The relative locations of the cell being written into and the cell being read out of are determined at periodic time intervals, and these relative locations are used to adjust the frequency of an internal oscillator which generates the stable clock. The instantaneous jitter on the digital data stream is absorbed by the FIFO.

14 Claims, 4 Drawing Sheets

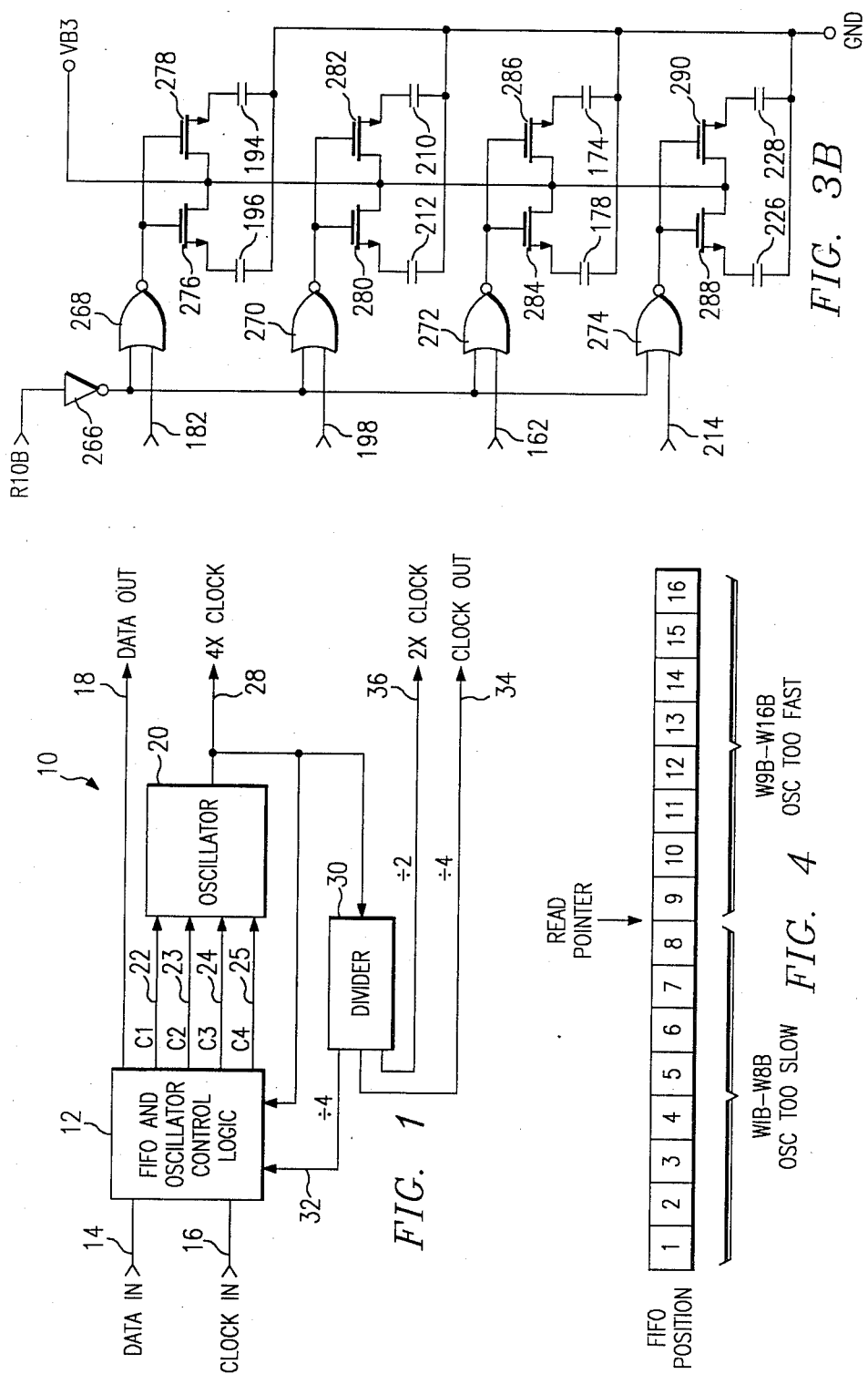

CLOCK MULTIPLIER/JITTER ATTENUATOR

TECHNICAL FIELD

This invention relates to telephone transmission line interface circuits, and more particularly, to clock multipliers/jitter attenuator circuits used in such interface circuits.

BACKGROUND OF THE INVENTION

Several detailed electrical specifications have been written for telephone transmission lines. One such specification is commonly referred to as the T1 specification originally developed by Bell Laboratories. The T1 specification provides for the transmission of digitally encoded signals at a 1.544 megabits per second bit rate.

The T1 specification requires that the digital pulses be of a certain amplitude and shape at a point on the transmission referred to as the digital cross connect. This specification requires that the output of a transmission line driver have a shape which is not a perfect square wave, but rather a square wave having overshoot on its rising edge and undershoot on its falling edge.

As transmitters were developed for the T1 specification, it became desirable to integrate the transmitter to the extent possible on a single integrated circuit chip without requiring the external reactive components previously used to form the proper overshoot and undershoot. One method of eliminating the discrete reactive components has been to digitally form the overshoot and undershoot by dividing the pulse into multiple segments. The first segment being the initial rise or overshoot voltage, another segment being the logical 1 voltage level of the pulse, another section being the undershoot voltage, and still another section being the logic 0 level or reference voltage level. In order to generate these four different voltage levels, a 2× or 4× clock must be generated by the transmitter and synchronized with the incoming clock from the digital data source. The present invention provides a circuit for generating either a 2× or 4× clock frequency in the transmitter.

Telephone transmission lines which use the T1 protocol develop jitter or noise-induced phase modulation in the data channels. This jitter accumulates on the transmission channel and can cause loss of synchronization between the transmitter and receiver of a telephone transmission line thereby causing loss of data in the transmission line.

A method used in the past to attenuate this jitter has been to use a First-In, First-Out (FIFO) storage register. Data is clocked into the FIFO in synchronization with the incoming data, and the data is clocked out of the FIFO by an independent clock which is close to the incoming clock frequency. However, the two clocks won't be in synchronization, and some of the incoming data will be lost if the independent clock is slower, even by a small amount, than the data rate of the incoming data, or additional erroneous bits will be added to the data stream if the independent clock is faster, even by a small amount, than the incoming data bit rate. While this loss of data or insertion of data may be negligible when voice data is being sent over the data channel, if computer data is being transferred over the transmission system, then the deleted bits or additional bits may cause serious problems to users of the transmission system.

Therefore it can be appreciated that a clock multiplier/jitter attenuator circuit for a transmitter for a digital transmission line which provides a multiple of the transmission line clock frequency that is synchronized to the average frequency of the incoming data and which also attenuates jitter appearing on the incoming digital channel and which can be fabricated almost entirely on a single integrated circuit chip is highly desirable.

SUMMARY OF THE INVENTION

It is therefore an object of this invention to provide a clock multiplier/jitter attenuator circuit for a transmitter circuit for a digital transmission line which provides a multiple clock frequency of the data transmission rate and which is synchronized to the average frequency of the incoming data channel and which can also be fabricated almost entirely on a single integrated circuit chip.

Shown in an illustrated embodiment of the invention is an apparatus for providing a low jitter, stable clock signal which is a multiple frequency of a reference clock signal exhibiting jitter. The apparatus includes a first and second recycling registers of N-bits in length. Each register contains a single logic 1 bit, the rest of the bits being logic 0's. The first register cycles a logic 1 bit in synchronization with the reference clock signal, and the second register cycles a single 1 bit in synchronization with a divided stable clock signal. A sampling circuit samples the relative position of the logic 1 in the first register with respect to the position of the logic 1 in the second register at predetermined intervals. A variable frequency oscillator provides the stable clock signal and varies its frequency in response to the output from the sampling circuit. Finally, a clock divider circuit divides the stable clock signal by a predetermined amount equal to the required multiple of the incoming clock frequency to provide the divided stable clock signal at its output.

Also shown in an illustrated embodiment of the invention is a method for providing a low jitter, stable clock signal which is a multiple frequency of a reference clock signal exhibiting jitter. Incoming data is written into sequential storage cells of an N-bit register in synchronization with an external clock and read out sequentially from the storage cells in synchronization with an internal clock. The internal clock is generated by dividing by a predetermined multiple the frequency of a variable frequency oscillator in which the frequency of the oscillator is varied according to the relative positions of the storage cell being written into and the storage cell being read out of at predetermined time intervals.

BRIEF DESCRIPTION OF THE DRAWINGS

The aforementioned and other features, characteristics, advantages, and the invention in general will be better understood from, the following, more detailed description taken in conjunction with the accompanying drawings in which:

FIG. 1 is a block diagram of a clock multiplier/jitter attenuator circuit according to the present invention;

FIGS. 3A-3D is a schematic diagram of the oscillator shown in FIG. 1; and,

FIG. 4 is a diagram showing the method for determining the direction of adjustment of the frequency of the oscillator of FIG. 1.

Figure 2A:
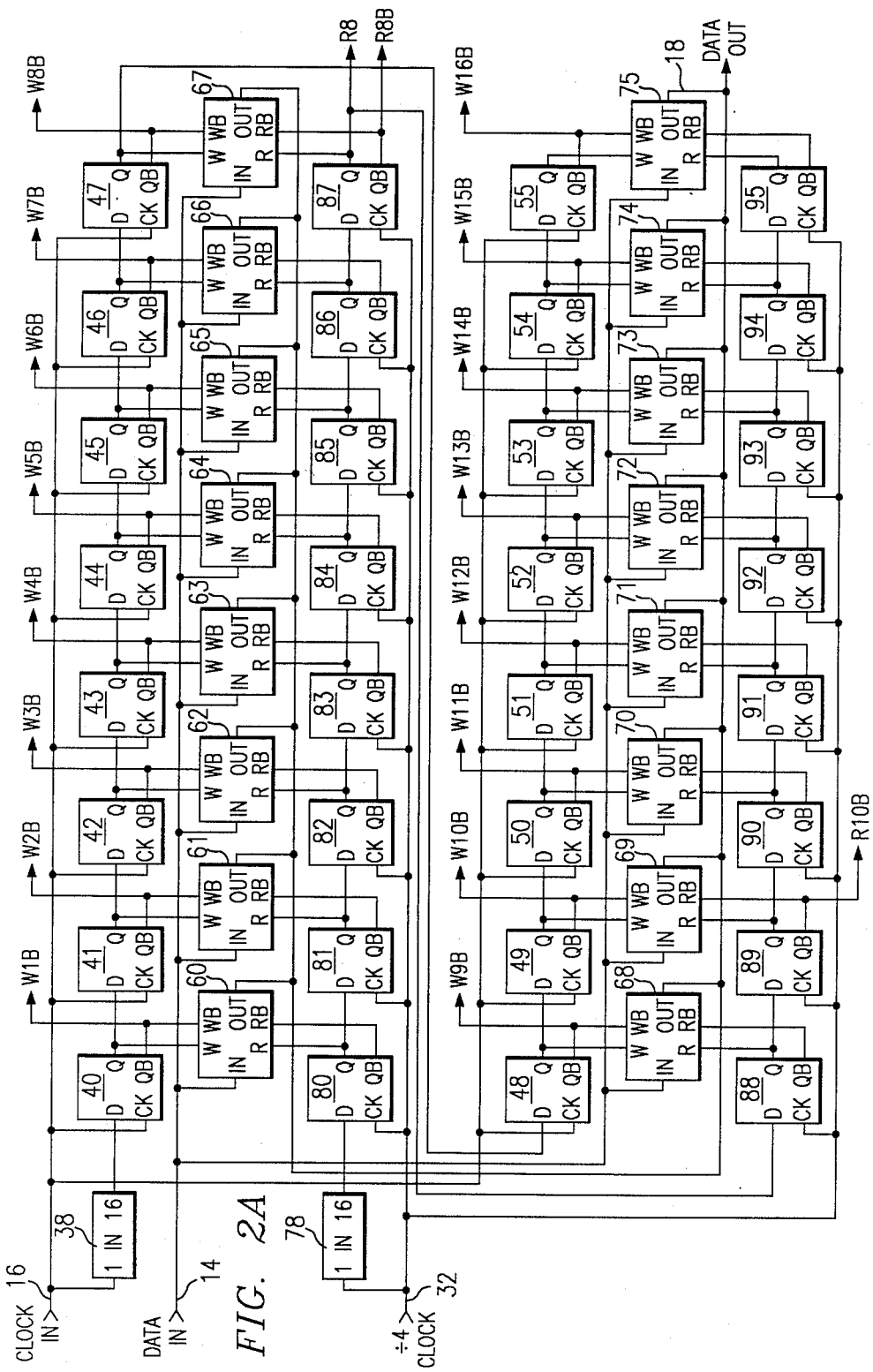
FIGS. 2A-2B is a circuit diagram of the FIFO of FIG. 1.

It will be appreciated that for purposes of clarity and where deemed appropriate, reference numerals have been repeated in the Figures to indicate corresponding features.

DESCRIPTION OF THE PREFERRED EMBODIMENT

The circuitry for providing the combined functions of a clock multiplier signal and a jitter attenuator according to the present invention operates as a phase lock loop. In the preferred embodiment the phase detector is a combination of a First-In, First-Out (FIFO) register for providing temporary storage of the incoming data in which incoming digital data is clocked into the FIFO at a rate set by the incoming or external clock and is clocked out of the FIFO by the clock signal derived from an internal tunable crystal oscillator. A digital timing or phase comparison circuit monitors the relative timing relationship between the incoming clock and the oscillator generated internal clock and provides signals to the oscillator to vary the frequency of the oscillator as necessary to keep the FIFO half full of data on the average. The oscillator in the preferred embodiment provides an output signal which is 4 times the frequency of the incoming clock and a divider is used to divide by 4 the oscillator frequency. The output of the divider is then fed back into the FIFO register and used to clock data out of the FIFO register.

Turning now to the drawings, a block diagram of a clock multiplier/jitter attenuator circuit according to the present invention is shown generally as element 10 in FIG. 1. A 16 bit FIFO and oscillator control logic block 12 receives two external signals, a data in signal on line 14 and an external clock in signal on line 16. The FIFO and oscillator control logic block 12 provides a data out signal on line 18 which is used by other circuitry not shown in the drawings. The FIFO and oscillator control logic block 12 also provides four signals to an oscillator 20 consisting of a C1 signal on line 22, a C2 signal on line 23, a C3 signal on line 24, and a C4 signal on line 25. The output of the oscillator 20 is a 4× clock signal on line 28. The 4× clock signal goes also to the input of a divider 30 and also is an input to the FIFO and oscillator control logic block 12. The divider 30 has a divide-by-4 output on line 32 which goes to the FIFO and oscillator control logic block 12. A similar divide-by-4 output appears on line 34 for other circuitry not shown in the drawings. The divider 30 also provides a divide-by-2 output or 2× clock on line 36.

The block diagram of FIG. 1 operates by receiving external data on line 14 and an external clock synchronized with the external data on line 16. The data is clocked into the FIFO and oscillator control logic block 12 by the external clock appearing on line 16 and is clocked out of the FIFO and oscillator control logic block 12 by the divide-by-4 output of the divider 30 appearing on line 32. This output data appears on data out line 18. The FIFO and oscillator control logic block 12 compares the relative timing of the external clock appearing on line 16 to the divide-by-4 clock appearing on line 32. Stated in a simplified manner, this comparison is achieved by determining which FIFO register cell is being addressed by the external clock signal on line 16 at a time when the divide-by-4 clock on line 32 is switching from addressing the eighth cell to addressing the ninth cell of a 16 bit FIFO register included within the FIFO and oscillator control logic block 12. If the external clock signal on line 16 is addressing any of the first eight FIFO cells when the divide-by-4 clock on line 32 is addressing the eighth cell, then a signal is sent on lines 22 through 25 to the oscillator 20 to increase the speed of the oscillator. Conversely, if the clock input signal at line 16 is addressing any one of the FIFO register cells 9-16 at a time when the divide-by-4 signal on line 32 is addressing the eighth cell of the FIFO register, then a signal is sent on lines 22-25 to the oscillator 20 to cause the oscillator to slow down.

The lines 22-25 control the loading of capacitors across the crystal of the oscillator 20, and the speed of the oscillator 20 is controlled by adding or subtracting these capacitive loads from the crystal in the oscillator 20. For example, if lines 22 and 23 are at one logic level and lines 24 and 25 are at the opposite logic level such that the capacitors controlled by lines 22 and 23 are presently loading the crystal of the oscillator 20, but the capacitors controlled by lines 24 and 25 are isolated from the crystal of the oscillator 20, and if then a determination is made that the oscillator is to speed up, then line 23 will be switched to the opposite logic state to remove capacitance from the crystal of the oscillator 20. Thus, the logic state of the lines 22-25 after each comparison depends upon the logic state of the lines 22-25 just prior to the comparison.

An important function of the present invention is that jitter or frequency modulation of the data in signal is attenuated by the circuit of FIG. 1. The data in and clock in signals on lines 14 and 16 respectively may exhibit jitter in that the frequency of the clock in and data in signals is phase modulated by noise so that the edges of the clock and the data in signal do not always occur at precise intervals, but vary from this precise timing by random amounts and at random frequencies being generated principally by noise in the system. Also, while the external clock in and data in signals are at a frequency of 1.544 megahertz and are crystal controlled when generated, the circuitry generating this timing has tolerances allowed by the T1 specification of ±130 parts per million (PPM) over a long term average. Thus, the circuit of FIG. 1 must be able to compensate for and track inputs with an average long term frequency of 1.544 Mhz ±130 PPM or else data will be lost from the incoming data or erroneous data will be inserted into the data stream. The circuit of FIG. 1 operates to attenuate the jitter noise and yet is able to track the long term average frequency of the data in signal.

Figure 2B:
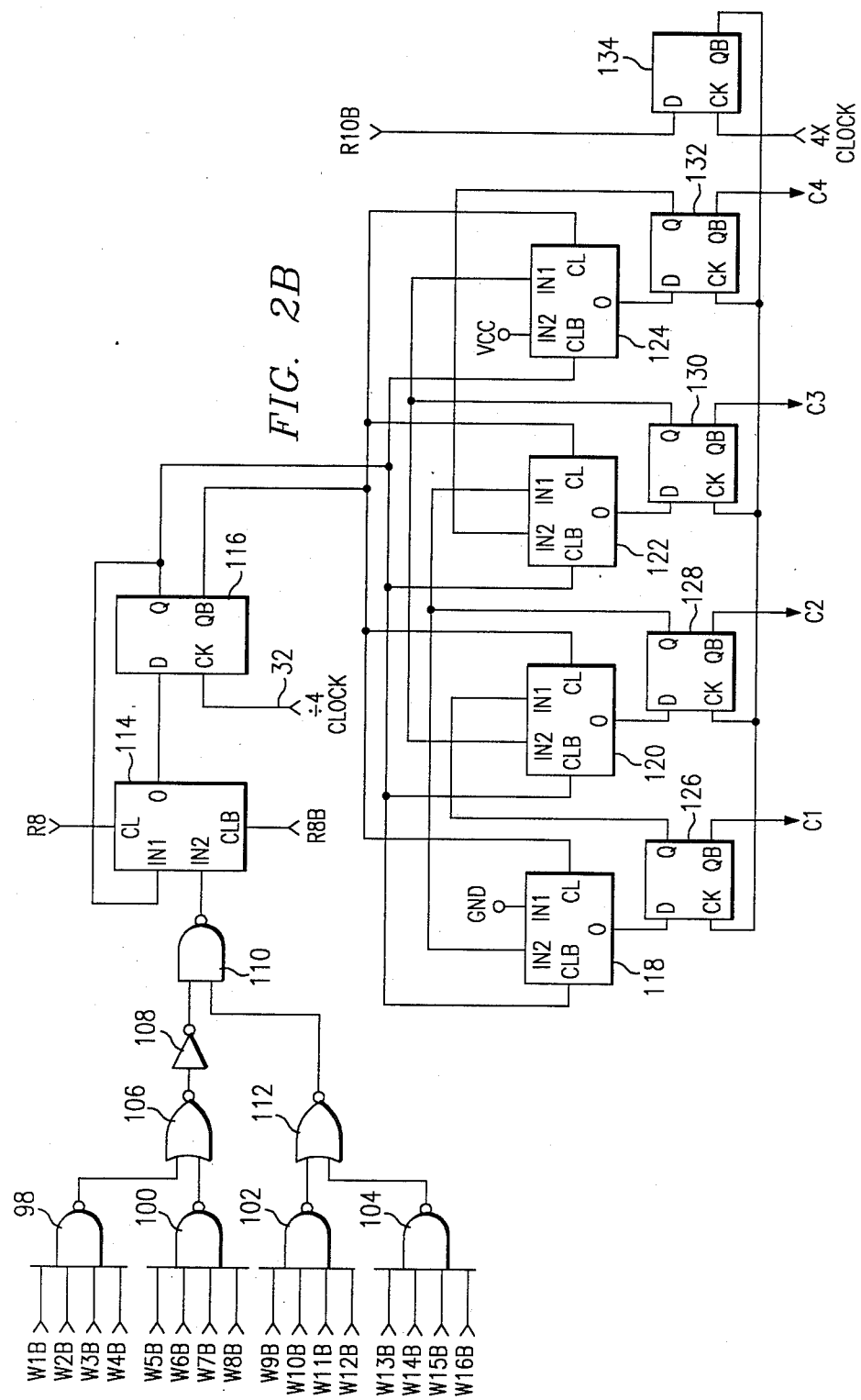

The FIFO and oscillator control logic block 12 is shown in detail in FIG. 2 in which FIG. 2A is a schematic diagram of the 16 bit FIFO register included therein and FIG. 2B is a schematic diagram of the oscillator control logic circuitry included therein. With reference now to FIG. 2A the external clock on line 16 is connected to the input of a 1 in 16 logic circuit 38 and to the clock inputs, labeled CK, of 16 D latches 40-55. The incoming data on line 14 is connected to the IN inputs of 16 storage cells 60-75 which correspond to the FIFO storage cells 1-16 respectively. The divide-by-4 clock on line 32 is connected to the input of another 1 in 16 logic circuit 78 and to the CK inputs of 16 additional D latches 80-95. The output of the 1 in 16 logic circuit 38 is connected to the D input of the D latch 40. The Q output of the D latch 40 is connected to the D input of the D latch 41. In a similar manner each of the Q outputs of the D latches 41-54 is connected to the D input of the next successive D latches 42-55 respectively. The Q output of the D latch 40 is also connected to the W input of a storage cell 60. The QB output of the D latch 40 is connected to the WB input of the storage cell 60. In a similar manner each of the Q outputs of the D latches 41-55 is connected to the W inputs of corresponding storage cells 61 through 75 respectively. Also the QB outputs of the D latches 41-55 are connected to the WB inputs of the corresponding storage cells 61 through 75 respectively. The QB outputs of each of the D latches 40-75 also are connected to the inputs of NAND gates shown in FIG. 2B. These QB outputs are shown as signals W1B-W16B corresponding to the QB outputs of D latches 40-75 respectively.

The output of the 1 in 16 logic circuit 78 is connected to the D input of the D latch 80. The Q output of the D latch 80 is connected to the D input of the D latch 81. In a similar manner the Q output of each of the D latches 81-94 is connected to the D input of the next successive D latches 82-95 respectively. The Q output of the D latch 80 is also connected to the R input of the storage cell 60. In a similar manner the Q outputs of the D latches 81-95 are connected to the R inputs of the storage cells 61-75 respectively. The QB output of the D latch 80 is connected to the RB input of the storage cell 60. In a similar manner the QB outputs of the D latches 81-95 are connected to the RB inputs of storage cells 61-75 respectively. The Q output of the D latch 87 is also connected to a signal line R8, and the QB output of the D latch 87 is connected to a signal line shown as R8B in FIG. 2A. These two signals, R8 and R8B, are connected to the R8 and R8B signal lines in FIG. 2B. The QB output of the D latch 89 is connected to a signal line shown as R10B in FIG. 2A and in FIG. 2B. The out terminals connection of the storage cells 60-76 are connected together and to the data out line 18. While not shown in the drawings, it will be understood that the D latches in the drawings have reset inputs for initializing the circuitry.

Turning now to FIG. 2B, the sixteen QB outputs from the D latches 40-55, labeled W1B-W16B, are connected to the inputs of four NAND gates 98, 100, 102, and 104. Specifically, the W1B, W2B, W3B and W4B lines form the four inputs to the NAND gate 98, while the W5B, W6B, W7B, and W8B form the four inputs to the NAND gate 100. The W9B, W10B, W11B, and W12B lines form the four inputs to the NAND 102, and the W13B, W14B, W15B, and W16B form the four inputs to the NAND gate 104. The output of the NAND gate 98 is connected to a first input of a NOR gate 106, and the output of NAND gate 100 is connected to a second input of the NOR gate 106. The output of the NOR gate 106 is inverted by an inverter 108, the output of which is connected to an input of another NAND gate 110. The output of NAND gate 102 is connected to the input of another NOR gate 112, and the output of NAND gate 104 is connected to a second input of the NOR gate 112. The output of the NOR gate 112 is connected to the second input of NAND gate 110 and the output of NAND gate 110 is connected to an input, labeled IN2, of a multiplexer circuit (MUX) 114.

The Q output of MUX 114 is connected to the D input of another D latch 116. The Q output of the D latch 116 is connected to a second input, labeled IN1, of the MUX 114. A control input to MUX 114, labeled CL, is connected to the line labeled R8, and a second control input, labeled CLB, of the MUX 114 is connected to the line labeled R8B. The clock input to the D latch 116 is connected to the divide-by-4 clock signal on line 32.

The Q output of the D latch 116 is also connected to the CLB inputs of four additional MUX circuits 118, 120, 122, and 124. The QB output of D latch 116 is connected to the CL inputs of the MUX circuits 118-124. The O output of the MUX 118 is connected to the D input of another D latch 126. The O output of the MUX 120 is connected to the D input of another D latch 128, the O output of the MUX 122 is connected to the D input of another D latch 130, and the O output of the MUX 124 is connected the D input of another D latch 132.

The INI input of MUX 118 is connected to ground potential. The IN2 input of the MUX 118 is connected to the 1N1 input of the MUX 122 and to the Q output of the D latch 128. The IN1 input of the MUX 120 is connected to the Q output of the D latch 126. The IN2 input of the MUX 120 is connected to the IN1 input of the MUX 124 and to the Q output of the D latch 130. The IN2 input of the MUX 122 is connected to the Q output of the D latch 132, and the IN2 input of the MUX 124 is connected to VCC, which is the positive supply voltage for the integrated circuit.

The clock inputs, labeled CK, of the D latches 126, 128, 130, and 132 are connected together and to the QB output of another D latch 134. The D input of the D latch 134 is connected to the line marked R10B, and the clock input to the D latch 134 is connected to the 4× clock signal on line 28. The QB outputs of the D latches 126, 128, 130, and 132 are connected to output lines labeled C1, C2, C3, and C4 respectively. These four output lines are connected as inputs to the oscillator circuit of FIG. 3.

Figure 3A:
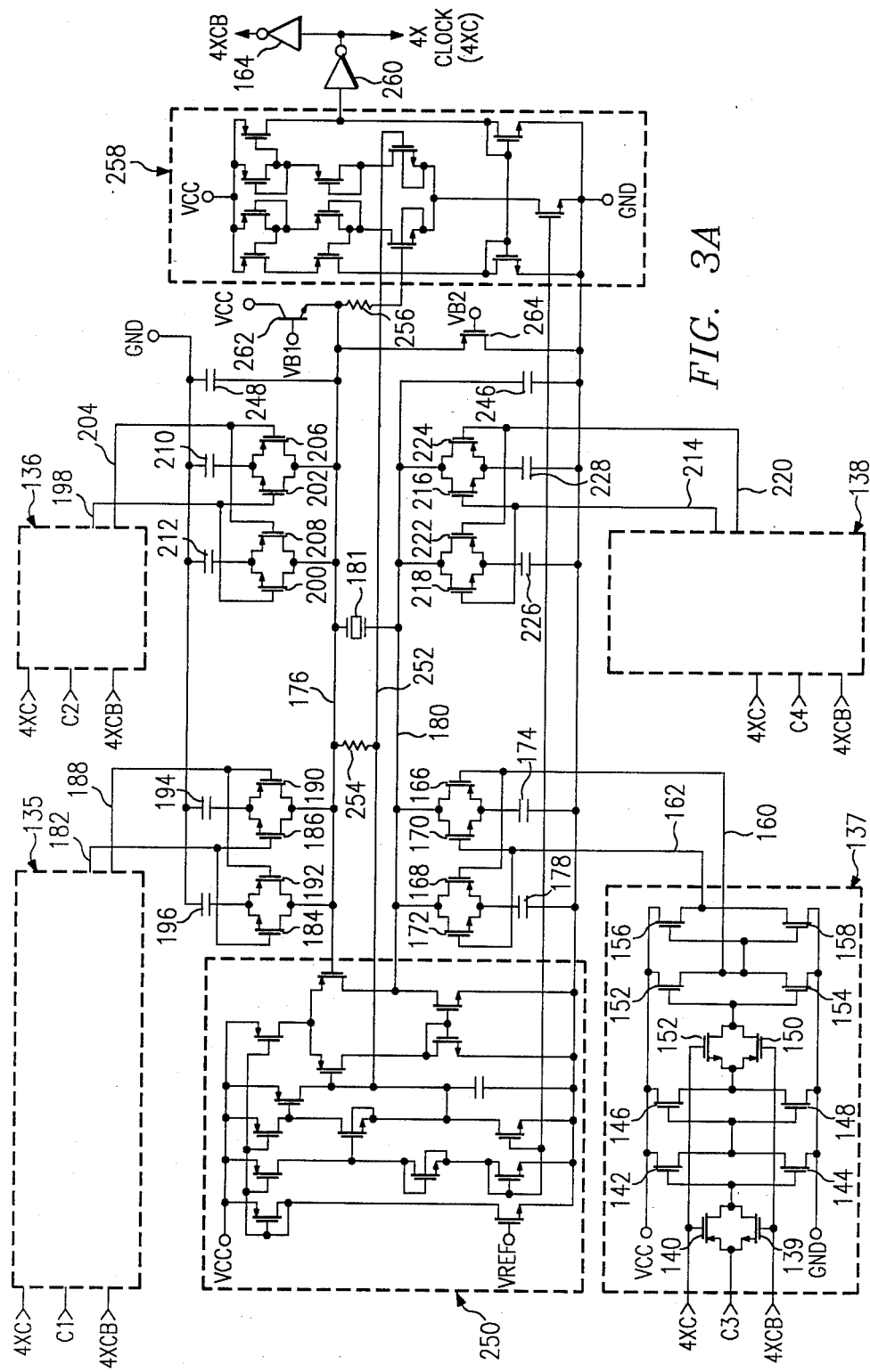

Turning now to FIG. 3A, the C1 signal from FIG. 2B is connected to an input of a synchronization circuit 135. The synchronization circuit 135 is repeated four times in FIG. 3, being shown as synchronization circuits 136, 137, and 138. The synchronization circuits 135-137 are conventional D latches of the type which require complementary clock input signals. One of the synchronization circuit 137 in the lower left hand corner of FIG. 3A shows the detailed circuitry of each of the other synchronization circuits 135, 136, and 138. The C3 signal is connected to the D input of the synchronization circuit 137. The 4× clock signal, designated as 4×C, is connected to the clock input of the synchronization circuit 137. As shown on the right hand side of FIG. 3, the 4×clock signal is inverted by an inverter 164 to form a 4×CB signal. The 4×CB signal is connected to the complementary clock input of the synchronization circuit 137. The 4× clock and 4×CB inputs to the synchronization circuits 135-138 are all applied to the same respective input pins. The C3 input to synchronization circuit 137 is replaced by the C1 input to synchronization circuit 135, by the C2 input to synchronization circuit 136, and by the C4 input to synchronization circuit 138.

The Q bar output 160 of the synchronization circuit 137 is connected to the gate of a P-channel transistor 166 and to the gate of another P-channel transistor 168. The Q output on line 162 of the synchronization circuit 137 is connected to the gate of an N-channel transistor 170 and to the gate of another N-channel transistor 172. The transistors 166 and 170, and the transistors 168 and 172, have commonly connected drains and sources to form analog switches. The common sources of transistors 166 and 170 are connected to a first terminal of a capacitor 174, the other terminal of which is connected to ground. The common drain connection of the transistors 166 and 170 forms a node 176. Similarly, the sources of transistors 168 and 172 are connected together and to a first terminal of a capacitor 178, the other terminal of which is connected to ground. The drains of transistors 168 and 172 are connected together to form a node 180.

A crystal 181 is connected between the nodes 176 and 180 and is physically located external to the integrated circuit that embodies all the other circuitry illustrated in FIGS. 1-3.

The Q output 182 of synchronization circuit 135, which corresponds to the Q output 162 of the synchronization circuit 137, is connected to the gate of an N-channel transistor 184 and to the gate of a another N-channel transistor 186. The Q bar output on line 188 of the synchronization circuit 135, which corresponds to the Q bar output 160 of the synchronization circuit 137, is connected to the gate of a P-channel transistor 190 and to the gate of another P-channel transistor 192. The transistors 184 and 192, and the transistors 186 and 190, have commonly connected drains and sources to form analog switches. The common sources of transistors 186 and 190 are connected to a first terminal of a capacitor 194, the other terminal of which is connected to ground. The common drain connection of the transistors 186 and 190 is connected to the node 180. Similarly, the sources of transistors 184 and 192 are connected together and to a first terminal of a capacitor 196, the other terminal of which is connected to ground. The drains of transistors 184 and 192 are connected together and to the node 176.

The Q output 198 of synchronization circuit 136, which corresponds to the Q output 162 of the synchronization circuit 137, is connected to the gate of an N-channel transistor 200 and to the gate of a another N-channel transistor 202. The Q bar output on line 204 of the synchronization circuit 136, which corresponds to the Q bar output 160 of the synchronization circuit 137, is connected to the gate of a P-channel transistor 206 and to the gate of another P-channel transistor 208. The transistors 202 and 206, and the transistors 204 and 208, have commonly connected drains and sources to form analog switches. The common sources of transistors 202 and 206 are connected to a first terminal of a capacitor 210, the other terminal of which is connected to ground. The common drain connection of the transistors 202 and 206 is connected to the node 180. Similarly, the sources of transistors 200 and 208 are connected together and to a first terminal of a capacitor 212, the other terminal of which is connected to ground. The drains of transistors 200 and 208 are connected together and to the node 176.

The Q output 214 of synchronization circuit 138, which corresponds to the Q output 162 of the synchronization circuit 137, is connected to the gate of an N-channel transistor 216 and to the gate of a another N-channel transistor 218. The Q bar output on line 220 of the synchronization circuit 138, which corresponds to the Q bar output 160 of the synchronization circuit 137, is connected to the gate of a P-channel transistor 222 and to the gate of another P-channel transistor 224. The transistors 218 and 222, and the transistors 216 and 224, have commonly connected drains and sources to form analog switches. The common sources of transistors 218 and 222 are connected to a first terminal of a capacitor 226, the other terminal of which is connected to ground. The common drain connection of the transistors 218 and 222 is connected to the node 180. Similarly, the sources of transistors 216 and 224 are connected together and to a first terminal of a capacitor 228, the other terminal of which is connected to ground. The drains of transistors 216 and 224 are connected together and to the node 176.

In addition to the switched capacitors 174, 178, 194, 196, 210, 212, 226, and 228 shown in FIG. 3, there are also two permanently connected capacitors respectively connected between the nodes 176 and 180 and ground. The first capacitor 246 is connected between ground and the node 180, and the second capacitor 248 is connected between ground and the node 176.

The crystal 181 is connected between one input and the output of an inverting amplifier 250 shown in the left-hand side of FIG. 3. The amplifier 250 is conventional in the art and therefore will not be described in detail. The crystal 181 and the amplifier 250 form an oscillator which oscillates at the crystal frequency which varies slightly with the amount of capacitance placed to load the crystal 181. Created inside the amplifier 250 is a reference voltage which appears on the node 252. A resistor 254 is connected between the nodes 252 and 176. The output of the amplifier 250 is connected to the node 180. The node 176 is coupled through a resistor 256 to the input of a comparator 258. The other input of the comparator 258 is the reference voltage on node 252. The comparator 258 detects the oscillation from the oscillator and squares the oscillation into a digital waveform which is buffered through an inverter 260 to form the 4× clock.

Connected to the node 176 is the emitter of an NPN bipolar transistor 262, the base of which is connected to a bias voltage VB1, and the collector of which is connected to VCC. Also connected to the node 176 is the source of a P-channel transistor 264. The gate of the transistor 264 is connected to another bias voltage VB2, and the drain of transistor 264 is connected to ground.

Turning now to FIG. 3B, a circuit for precharging the crystal 181 frequency control capacitors 174, 178, 194, 196, 210, 212, 226, and 228 includes an inverter 266, the input of which is connected to the R10B line from FIG. 2A. The output of the inverter 266 is connected to one input of four NOR gates 268, 270, 272, and 274. The second input of NOR gate 268 is connected to line 182 from FIG. 3A. The second input of NOR gate 270 is connected to line 198 from FIG. 3A. The second input of NOR gate 272 is connected to line 162 from FIG. 3A. The second input of NOR gate 274 is connected to line 214 from FIG. 3A.

The output of the NOR gate 268 is connected to the gates of two N-channel transistors 276 and 278. The source of transistor 276 is connected to one terminal of the capacitor 196 shown in FIG. 3A, and the source of transistor 278 is connected to one terminal of the capacitor 194 of FIG. 3A. The other terminals of the capacitors 196 and 194 are connected to ground as shown in FIG. 3A. The output of the NOR gate 270 is connected to the gates of two N-channel transistors 280 and 282. The source of transistor 280 is connected to one terminal of the capacitor 212 shown in FIG. 3A, and the source of transistor 282 is connected to one terminal of the capacitor 210 of FIG. 3A. The other terminals of the capacitors 212 and 210 are connected to ground as shown in FIG. 3A. The output of the NOR gate 272 is connected to the gates of two N-channel transistors 284 and 286. The source of transistor 284 is connected to one terminal of the capacitor 178 shown in FIG. 3A, and the source of transistor 286 is connected to one terminal of the capacitor 174 of FIG. 3A. The other terminals of the capacitors 178 and 174 are connected to ground as shown in FIG. 3A. The output of the NOR gate 274 is connected to the gates of two N-channel transistors 288 and 290. The source of transistor 288 is connected to one terminal of the capacitor 226 shown in FIG. 3A, and the source of transistor 290 is connected to one terminal of the capacitor 228 of FIG. 3A. The other terminals of the capacitors 226 and 290 are connected to ground as shown in FIG. 3A. The sources of the transistors 276, 278, 280, 282, 284, 286, 288, and 290 are connected together and to a bias voltage VB3.

The divider 30 of FIG. 1 is common in the art has not been shown in detail for purposes of clarity and brevity.

OPERATION OF THE FIFO AND OSCILLATOR CONTROL LOGIC

The FIFO register circuit of FIG. 2A is used to (1) store the digital data so that it can be synchronized with the internal clock from the oscillator 20 and (2) to provide sampling data on the relative positions of the memory cells being written into or read from at predetermined time intervals.

Specifically, the 1 in 16 logic circuits 38 and 78 pass 1 of 16 clock pulses from their input to their output and suppress the succeeding 15 clock pulses. Circuitry for performing this function is well known in the art and is not shown for clarity.

The output of the 1 in 16 logic circuit 38 is input into the D latch 40 and passed to the Q output of D latch 40 upon the rising edge of a pulse at the clock input of the D latch 40. Therefore the Q output of D latch 40 will have a 1 at its output during one of the clock in periods and will have a 0 at the next 15 clock periods. The Q output of D latch 40 is connected to the D input of D latch 41 and the logic 1 on the Q output of D latch 40 will be coupled to the Q output of D latch 41 on the next clock pulse at which time the Q output of D latch 40 will return to a logic 0 state. In this manner each of the Q outputs of each of the D latches 40-55 successively goes to a logic 1 level for one clock period and then returns to a logic 0 level for the next 15 clock periods. Thus the D latches 40-55 pass a logic 1 level around through the D latches to form a recycling or cyclic register. Alternatively, a single logic 1 level could be introduced into the D latches 40-55, and the Q output of D latch 55 could be connected to the D input of D latch 40 (and disconnecting the connection to the 1 in 16 logic circuit 38) to form a cyclic register.

In the same manner, the D latches 80 through 95 pass a logic 1 signal through the D latches 80-95.

The D latches 40-55 are used to control the write enable lines of the storage cells 60-75. When the Q output of one of the D latches 40-55 is at a logic 1 level and the QB output is at a logic 0 level, then the corresponding storage cell 60-75 will be write enabled, and the data appearing at the IN input to the corresponding storage cell will be stored in the storage cell. Conversely, when the Q outputs of fifteen of the other D latches 40-55 are at a low logic level and the QB outputs are at a high logic level, then the corresponding fifteen of the storage cells 60-75 will not be write enabled; that is the signals appearing at the IN inputs to these storage cells will be ignored by the storage cells.

Thus the logic 1 which is passed from one D latch to the next successive D latch of the D latches 40-55 enables data at the data in line 16 to be written into one of the respective memory cells 60-75. Thus the position of the logic 1 present a write pointer indicating the address where the incoming data is presently being written.

In a similar manner, the D latches 80-95 can be considered as read latches in which the logic 1 at the Q output and the logic 0 at the QB output of any of the D latches 80-95 will cause a read enable for the respective storage cells 60-75 and the contents of the data stored in the respective cell will be placed on the data out line 18. Thus the D latch 80-95 presently containing a logic level 1 at its Q output can be considered as a read pointer indicating the address from which the storage cell data is presently being read.

An important consideration of the present invention is that the clock in signal on line 16 and the divide-by-4 clock on line 32 are not required to be exactly synchronized with each other, which is a desirable feature of this invention. If the two clocks were exactly synchronized, any jitter of the clock in signal on line 16 would also have to appear in the divide-by-4 clock signal on line 32 and in the clock out signal on line 34. In the present invention, though, the clock in signal on line 16 and the divide-by-4 clock on line 34 need not be constantly in phase and, indeed, may vary over several data periods. At a data rate of 1.544 megabits per second each data period is 648 nanoseconds. On the average, for the preferred illustrated herein, the separation between the write pointer and the read pointer would be half of the length of the FIFO register or 8 storage cells apart. Thus the preferred embodiment can allow for jitter which causes the accumulative difference in phase between the two clocks to be up to ±7 data periods in length.

The control of the oscillator frequency is accomplished by first determining the relative timing relationship between the read pointer and the write pointer and then by adjusting the capacitive load on the crystal 181.

The relative timing relationship is determined by periodically and at predetermined intervals determining the separation between the write pointer and the read pointer. In the preferred embodiment the circuit of FIG. 2B detects whether the write pointer is pointing to one of the first 8 storage cells, i.e., storage cells 60-68, or to the second 8 storage cells, storage cells 69-75, when the read pointer is switching from the eighth storage cell, storage cell 67, to the ninth storage cell, storage cell 68 in FIG. 2A.

With reference now to FIG. 4, the 16 storage cells 60-76 are shown as FIFO register positions 1-16. The read pointer is shown at the transition between FIFO register position 8 and FIFO register position 9. As will be described below, this position is when the test is made to determine whether the write pointer is addressing the first 8 storage cells or the second 8 storage cells. If the write pointer is addressing one of the first 8 storage cells, then the oscillator frequency is adjusted to increase the oscillation frequency. Conversely, if the write pointer is addressing one of the storage cells 9-16, then the oscillator frequency is decreased. Stated another way, if the number of storage cells between the write pointer and the read pointer, counting in the direction in which the storage cells are sequentially addressed, is less than the number of storage cells between the read pointer and the write pointer, then the oscillator frequency is increased. And conversely, if the number of storage cells between the write pointer and the read pointer is greater than the number of storage cells between the read pointer and the write pointer, then the oscillator frequency is decreased. Thus the goal is to have the write pointer vary slightly about the transition between the first storage cell and the 16th storage cell (which correspond to storage cells 60 and 75 in FIG. 2A) at the sampling time.

With reference now to FIG. 2B, the QB outputs of the write D latches 40–55, shown as W1B–W16B, are connected to the inputs of the four NAND gates 98–104. Since at any one particular time only one of the W1B–W16B inputs will be at a low logic level, indicating the position of the write pointer, only one of the NAND gates will have a logic 1 at its output, the rest having a logic 0 at their outputs. Therefore the output of NAND gate 110 will be a logic 0 if the write pointer is in one of the first 8 FIFO register positions (i.e., corresponding to a low logic level on one of W1B–W8B) and a logic 1 when the write pointer is in the 9th–16th FIFO register position (corresponding to low logic level on one of W9B–W16B).

The IN1 input of MUX 114 is coupled to the O output MUX 114 when the CL input of MUX 114 is a low logic level and the CLB input is at a high logic level. Conversely, the IN2 input of MUX 114 will be coupled to the O output of MUX 114 when the CL input is at a high logic level and the CLB signal is at a low logic level. Thus, when the read pointer is pointing to any of the FIFO register locations other than the location 8, the O output of MUX 114 will be the same logic level as the IN1 input.

Since the O output is passed to the Q output of D latch 116 on the rising edge of the divide-by-4 clock on line 32, and since the Q output of D latch 116 is connected to the In input of MUX 114, the Q output of D latch 116 will remain constant until the R8 output goes to a high logic level and the R8B line goes to a low logic level. At this time the output of logic gate 110 will be passed to the O output of MUX 114 and will pass to the Q output of D latch 116 upon the next rising edge of the divide-by-4 clock. Thus the Q output of D latch 116 will show the relative position of the write pointer during the last transition of the read pointer from the FIFO register position 8 to the FIFO register position 9. From the above discussion, it is seen that if the Q output of D latch 116 is at a logic 0 level, then the write pointer is within the FIFO register position 1–8 signaling that the oscillator is to increase in frequency. Conversely, if the Q output of D latch 116 is at a logic 1 level, then the write pointer is in FIFO register position 9–16 at the time when the read pointer was changing from FIFO register position 8 to FIFO register position 9, thereby signaling the oscillator to slow down.

Turning now to capacitor control logic consisting of MUXs 118–124 and D latches 126–134, the capacitor control lines C1–C4 are the QB outputs of D latches 126–132. The D latches 126–132 receive their data from the output of the MUXs 118–124 respectively and are clocked by the QB output of D latch 134. The D latch 134 transfers the logic level present on its D input on the rising edge of the 4× clock signal following the change of the R10B signal from a high logic level to a low logic level.

The 4× clock is used in D latch 134 to help synchronize the changing of the capacitors at a time which will introduce the least amount of discontinuity in the oscillator. The 4× clock is used rather than the divide-by-4 clock because its transitions are much closer in time to the oscillator transitions since the divide-by-4 clock edges are delayed by the propagation times of the logic circuitry in the divider circuit 30.

The R10B time period is chosen as a convenient time to switch the capacitors after the signals have had time to propagate through the MUXs 118–124 and into the D latches 126–132.

The MUXs 118–124 operate to either fill to a logic level 1's from the right to the left or to empty to a logic level 0's from the left to the right depending on the decision to increase or decrease the oscillation frequency of the oscillator. The MUXs 118–124 operate in the same manner as the MUX 114 in that when the CL line is high and the CLB input is low, then the IN2 input is passed to the O output. Conversely, when the CL line is low and the CLB input is high, then the IN1 input is passed to the O output. Thus when the Q. output of D latch 116 is high and the QB output is low, then the IN2 inputs to the MUXs 118–124 will be passed to the 0 output. The IN2 input for MUX 124 is VCC which is a logic 1 level. And the O output of MUX 124 will be a logic 1 and the Q output of D latch 132 will become a logic 1 at the next rising edge of the clock pulse applied to the CK input of D latch 132. The QB output of D latch 132 will then become a logic 0 which will operate to remove the capacitance associated with line C4 from the crystal 181. However the IN2 input of MUX 122 may be a 1 or a 0 depending on the previous state of the Q output of D latch 132 which in turn was determined by the previous state of the O output of MUX 124. Similarly, the IN2 input of MUX 120 is determined by the previous Q output of D latch 130 which was determined by the previous O output of MUX 122. Correspondingly, the IN2 input of MUX 118 is determined by the previous state of the Q output of D latch 128 which is determined by the previous state of the O output of MUX 120.

Thus, if the Q output of D latch 116 is at a logic 1 level for 4 cycles of the read pointer in the FIFO register circuit, then the VCC input to MUX 124 will propagate through D latch 132 to the IN2 input of MUX 122, through the D latch 130 into the IN2 input of MUX 120 and through the D latch 128 to the IN2 input of MUX 118 and to the input of D latch 126. At this point all of the D inputs and Q outputs of the D latches 126–132 would be at logic 1's and all the C1–C4 lines would be at a logic 0's which would disconnect all capacitors from loading the crystal 118 controlled by the lines C1–C4. Consequently, the oscillator frequency would increase.

Correspondingly, if the Q output of D latch 116 is a logic 0, then the IN1 input of MUX 118, which is at ground, will be passed to the D input of D latch 126 which in turn will be passed to the Q output of D latch 126. The Q output of D latch 126 will be passed through the IN1 input of MUX 120 into the D input of D latch 128 upon the next rising edge of the clock into the D latches 126–132 in a manner to shift the outputs of the D latches 126–132 to the right one position. Thus, if the Q output of D latch 116 is a logic O for 4 cycles of the read pointer, then the O outputs of MUXs 118–124 and the Q outputs of D latches 126–132 will all be at a logic 0's and the lines C1–C4 will be at a logic 1's, thereby causing the most capacitance loading on the crystal 181 to slow the oscillator to its lowest frequency.

Stated in another way, if the circuit of FIG. 2B detects that the oscillator is running too slowly, then the C4 line will go to a logic level 0 and the C3 line will become the state of the previous C4 line, the C2 line will become the state of the previous C3 line, and the C1 line will become the state of the previous C2 line. If the circuit detects that the oscillator is operating too fast, then the C1 line will go to a logic level 1 and the C2 line will become the same logic state as the previous C1 line, the C3 line will become the same as the previous C2 line, and the C4 line will become the same logic state as the previous C3 line.

OSCILLATOR OPERATION

Turning now to the oscillator circuitry shown in FIG. 3A, the synchronization circuits 135-138 operate to synchronize the addition and removal of capacitive load to the crystal 181 in order to reduce as much as possible discontinuity in the oscillator wave form. After resynchronization, the C1-C4 signals then operate to control the amount of capacitance loading the crystal 181. A low logic level on the C1, C2, C3, or C4 lines causes a high logic level on the output lines 188, 204, 160, and 220 respectively which in turn places a high logic level on the gates of the P-channel transistors of the respective analog switches to disable these transistors. And since the opposite polarity output lines consisting of lines 182, 198, 162, and 214 are a low logic level at this time, the corresponding N-channel transistors of the analog switches are also disabled to thereby isolate the respective capacitors from the nodes 176 and 180. Conversely a high logic level on the C1, C2, C3, or C4 lines causes a low logic level on the output lines 188, 204, 160, and 220 respectively which in turn places a low logic level on the gates of the P-channel transistors of the respective analog switches to enable these transistors. And since the opposite polarity output lines consisting of lines 182, 198, 162, and 214 are a high logic level at this time, the corresponding N-channel transistors of the analog switches are also enabled to thereby couple the respective capacitors to the nodes 176 and 180.

The NPN transistor 262 operates to clamp the node 176 from going below ground potential. The bias voltage VB1 is approximately one base-emitter voltage drop above ground and is generated by circuitry not shown in the drawings. The P-channel transistor 264 operates to clamp node 176 from going above VCC. The bias voltage VB2 is approximately one threshold voltage below VCC and is also generated by circuitry not shown in the drawings. This circuitry is used to keep the node 176 from going below ground or above VCC which can cause charge to be injected into the substrate and disturb the charge on the capacitors 174, 176, 194, 196, 210, 212, 226, and 228 which are not loading the crystal 181. These capacitors which have had their charge altered can cause discountinuites in the oscillator when they are electrically connected to the nodes 176 or 180.

For the same reason, the capacitor precharge circuitry shown in FIG. 3B operates to precharge the capacitors 174, 176, 194, 196, 210, 212, 226, and 228 when they are not electrically connected to the nodes 176 or 180, i.e, when the analog switches connected between each of the capacitors and the nodes 176 and 180 are non-conductive. The signal R10B operates to disable or make non-conductive the transistors 276, 278, 280, 282, 284, 286, 288, and 290 during the time when the C1-C4 lines are changing.

In the preferred embodiment of the invention, the capacitors 174, 178, 194, 196, 210, 212, 226, and 228 are all typically 15 picofarads and the use of the 4 pair of switch capacitors enables the circuit of FIG. 3 to vary the frequency of the oscillator approximately plus or minus 220 PPM.

The crystal 181 used in FIG. 3A is preferably cut for a parallel resonant oscillation at 6.176000 megahertz ±50 ppm using a load/training capacitance equal to $(47.1 \times CO + 6898)/(47.1 + 2 \times CO)$ where CO is the inherent shunt capacitance in picofarads of the crystal as specified by the crystal manufacturer. It is also preferable to take into account the series resonant frequency, fs, the crystal the maximum allowable series resonant frequency preferably is less than or equal to the crystal training frequency minus the sum of $2012.8 + 94.2 \times CO$.

The frequency multiplier/jitter attenuator circuit according to the present invention provides a multiple frequency clock which is stable compared to the jitter which may be present in the incoming data rate, and which is a high frequency clock, being four times the average or long term frequency of the incoming data rate in the preferred embodiment.

Although the invention has been described in part by making detailed reference to a certain specific embodiment, such detail is intended to be and will be understood instructional rather than restrictive. It will be appreciated by those skilled in the art that many variations may be made in the structure and scope of operation without departing from the spirit and scope of the invention, as disclosed in the teachings contained herein.

For example, the size of the switch capacitors need not be uniform but may be varied in such a manner as to cause an approximately equal frequency shift with each additional capacitor. It has been found that the addition of a first capacitance causes a frequency shift which is considerably greater than the frequency shift caused by the subsequent addition of an equal capacitance across the crystal. Also the capacitors could be switched or disconnected from the crystal by switching circuitry which ramps the capacitance at a controlled rate rather than causing an abrupt change in capacitance.

What is claimed is:

1. Apparatus for providing a clock signal which has low jitter and is a multiple frequency of the average frequency of an external clock exhibiting jitter, and which is tolerant to said jitter on said external clock comprising:

(a) an N-bit storage register having N individual storage cells;

(b) data write means coupled to said N-bit storage register for writing external data into said N individual storage cells in sequence at a rate determined by said external clock;

(c) data read means coupled to said N-bit storage register for reading said external data out of said N individual storage cells in sequence at a rate determined by an internal clock;

(d) address sampling means coupled to said data write means and said data read means for determining the relative location of the one of said N individual storage cells being written into by said write circuitry means with respect to the location of the one of said N individual storage cells being read from at the same time, and for applying a signal at an internal node which is indicative of said relative position;

(e) oscillator means coupled to said address sampling means for providing a high frequency clock which has a frequency which is a multiple of the average frequency of said external clock, said oscillator means having a frequency which varies in response to said signal at said internal node;

(f) clock divider means coupled to said oscillator means for dividing said high frequency clock signal by a predetermined amount to thereby provide said internal clock; and (g) whereby said high frequency clock has less jitter than said external clock exhibiting jitter, said N-bit storage register being able to absorb instantaneous jitter exhibited by said external clock.

2. The clock multiplier circuit as set forth in claim 1 wherein said address sampling means determines said relative locations at periodic intervals.

3. The clock multiplier circuit as set forth in claim 2 wherein said periodic intervals coincide with the time that said data read means is changing its read address from a predetermined one of said N individual storage cells to the next sequential storage cell of said N individual storage cells.

4. The clock multiplier circuit as set forth in claim 1 wherein said oscillator is a crystal based oscillator.

5. The clock multiplier circuit as set forth in claim 4 wherein said frequency of said oscillator means is varied by varying the capacitive load on said crystal.

6. Apparatus for providing a relatively stable high frequency clock signal which is a multiple frequency of a reference clock exhibiting jitter, said apparatus being tolerant to said jitter on said reference clock and comprising:

(a) a first and a second N-bit recycling register, each of said first and second N-bit recycling registers containing a single logic 1 state, and N−1 logic 0 states wherein said first N-bit recycling register transfers said single logic 1 state in a serial fashion from one bit position to the next successive logic bit position in synchronization with said reference clock signal, and said second N-bit recycling register transfers said single logic 1 state in a serial manner from one bit position to the next successive bit position in synchronization with an internal clock signal;

(b) register sampling means coupled to said first and second N-bit recycling registers for sampling the relative position of said single logic 1 states in said first N-bit register with respect to the position of said single logic 1 state in said second N-bit register and for applying a signal at an internal node which is indicative of said relative position;

(c) oscillator means coupled to said register sampling means for providing said high frequency clock signal which is a multiple of the average frequency of said reference clock, said oscillator means having a frequency which varies in response to said signal at said internal node wherein said high frequency clock signal is more stable than said reference clock signal exhibiting jitter; and (d) clock divider means for dividing said high frequency clock signal by a predetermined amount equal to the multiplication factor of said multiple frequency of said reference clock to provide said internal clock signal.

7. The clock multiplier circuit as set forth in claim 6 wherein said register sampling means determines said relative positions at periodic intervals.

8. The clock multiplier circuit as set forth in claim 7 wherein said periodic intervals coincide with the time that said single logic 1 state in said second recycling register changes from a predetermined bit position to the next successive bit position.

9. The clock multiplier circuit as set forth in claim 6 wherein said oscillator is a crystal based oscillator.

10. The clock multiplier circuit as set forth in claim 9 wherein said frequency of said oscillator means is varied by varying the capacitive load on said crystal.

11. A method for providing a relatively stable clock signal which is a multiple frequency of the average frequency of an external clock exhibiting jitter comprising the steps of:

(a) indexing a first pointer through sequential positions of a first cyclic register at a rate determined by said external clock;

(b) indexing a second pointer through sequential positions of a second cyclic register at a rate determined by an internal clock;

(c) determining the relative positions of said first pointer and said second pointer;

(d) generating said relatively stable clock signal in an oscillator;

(e) varying the frequency of said oscillator in response to said determination step; and (f) dividing said relatively stable clock signal by an amount equal to the multiplication factor of said multiple frequency of the average frequency of said external clock to provide said internal clock, whereby said output signal of said oscillator is a stable clock signal which is a multiple frequency of the average frequency of said external clock, and whereby said relatively stable clock signal is more stable than said external clock signal exhibiting jitter.

12. The method for providing a clock signal as set forth in claim 11 wherein said determination step determines said relative positions of said first pointer and said second pointer at periodic intervals.

13. The method for providing a clock signal as set forth in claim 12 wherein said periodic intervals coincide with the time that said second pointer is changing its position from a predetermined position of said second cyclic register to the next sequential position of said second cyclic register.

14. A method for providing a relatively stable clock signal which is a multiple frequency of an external clock exhibiting jitter, said method being tolerant to said jitter on said external clock and comprising the steps of:

(a) writing incoming data sequentially into the storage cells of an N-bit register in synchronization with said external clock;

(b) reading out sequentially said incoming data from said storage cells in synchronization with an internal clock;

(c) determining the relative positions of the storage cell being written into and the storage cell being read out of at predetermined time intervals;

(d) generating said relatively stable clock signal in an oscillator;

(e) varying the frequency of said oscillator in response to said determination step; and (f) dividing an output signal of said oscillator by an amount equal to the multiplication factor of said multiple frequency of said external clock to provide said internal clock, whereby said output signal of said oscillator is a clock signal which is a multiple frequency of said external clock, whereby said relatively stable clock signal is more stable than said external clock signal exhibiting jitter, and whereby instantaneous jitter exhibited by said external clock is absorbed by said N-bit register.

* * * * *